United States Patent
Robinson et al.

(10) Patent No.: US 7,894,563 B2
(45) Date of Patent: Feb. 22, 2011

(54) CLOCK RECOVERY CIRCUIT AND A METHOD OF GENERATING A RECOVERED CLOCK SIGNAL

(75) Inventors: Anthony J. Robinson, Bury St. Edmunds (GB); Christopher M. Towers, Warrington (GB)

(73) Assignee: Virtensys Limited, Stockport (GB)

( * ) Notice: Subject to any disclaimer, the term of this patent is extended or adjusted under 35 U.S.C. 154(b) by 688 days.

(21) Appl. No.: 11/138,910

(22) Filed: May 27, 2005

(65) Prior Publication Data

US 2005/0265504 A1 Dec. 1, 2005

Related U.S. Application Data

(60) Provisional application No. 60/574,674, filed on May 27, 2004.

(51) Int. Cl.
*H03D 3/24* (2006.01)
(52) U.S. Cl. ...................................................... 375/375
(58) Field of Classification Search ................. 375/375, 375/373, 371, 354
See application file for complete search history.

(56) References Cited

U.S. PATENT DOCUMENTS

| | | | | |
|---|---|---|---|---|
| 5,614,855 A * | 3/1997 | Lee et al. | ..................... | 327/158 |
| 6,002,279 A * | 12/1999 | Evans et al. | ................... | 327/144 |
| 6,163,223 A * | 12/2000 | Kapetanic et al. | .............. | 331/2 |
| 6,574,268 B1 * | 6/2003 | Bergamo | ..................... | 375/142 |
| 6,911,853 B2 * | 6/2005 | Kizer et al. | ................... | 327/158 |
| 2002/0196864 A1 * | 12/2002 | Booth et al. | ................. | 375/296 |
| 2004/0114632 A1 * | 6/2004 | Yuuki et al. | .................. | 370/503 |
| 2004/0217789 A1 * | 11/2004 | Kwak et al. | .................. | 327/158 |
| 2004/0264615 A1 * | 12/2004 | Ho et al. | ...................... | 375/355 |
| 2004/0266485 A1 * | 12/2004 | Paramesh et al. | ......... | 455/562.1 |
| 2005/0212566 A1 * | 9/2005 | Wilson | ....................... | 327/105 |

\* cited by examiner

*Primary Examiner*—David C Payne
*Assistant Examiner*—Brian J Stevens
(74) *Attorney, Agent, or Firm*—Pillsbury Winthrop Shaw Pittman LLP

(57) ABSTRACT

The present invention relates to a clock recovery circuit for generation of a recovered clock signal from a received data stream using a weighted combination of phase component signals. The clock recovery circuit comprises: a detector to detect the phase of a received data stream; a selector comprising a differential generator arranged to generate at least two related signals in dependence on the detected phase; and a clock signal generator to receive the at least two related signals and select related proportions of two or more of a plurality of phase component signals for combination, thereby to generate a recovered clock signal.

5 Claims, 5 Drawing Sheets

| PM Phase | Digital Input with reference to the PM's tail connections | | | |
|---|---|---|---|---|
| | 0deg Tail | 90deg Tail | 180deg Tail | 270deg Tail |
| 0deg to 90deg | 1111<br>0111<br>0011<br>0001<br>0000 | 0000<br>1000<br>1100<br>1110<br>1111 | ..<br>..<br>..<br>..<br>.. | ..<br>..<br>..<br>..<br>.. |
| 90deg to 180deg | ..<br>..<br>..<br>..<br>.. | 1111<br>1110<br>1100<br>1000<br>0000 | 0000<br>0001<br>0011<br>0111<br>1111 | ..<br>..<br>..<br>..<br>.. |
| 180deg to 270deg | ..<br>..<br>..<br>..<br>.. | ..<br>..<br>..<br>..<br>.. | 1111<br>0111<br>0011<br>0001<br>0000 | 0000<br>1000<br>1100<br>1110<br>1111 |
| 270deg to 0deg | 0000<br>0001<br>0011<br>0111<br>1111 | ..<br>..<br>..<br>..<br>.. | ..<br>..<br>..<br>..<br>.. | 1111<br>1110<br>1100<br>1000<br>0000 |
| 0deg to 90deg | 1111<br>0111<br>0011<br>0001<br>0000 | 0000<br>1000<br>1100<br>1110<br>1111 | ..<br>..<br>..<br>..<br>.. | ..<br>..<br>..<br>..<br>.. |

Fig. 5

CLOCK RECOVERY CIRCUIT AND A METHOD OF GENERATING A RECOVERED CLOCK SIGNAL

CROSS-REFERENCE TO RELATED APPLICATION

This application relies for priority on U.S. Provisional Patent Application Ser. No. 60/574,674, filed May 27, 2004, the contents of which are incorporated herein by reference.

The present invention relates to a clock recovery circuit and a method of generating a recovered clock signal.

When data is transmitted as a serial bit stream and received at a receiver, a clock signal is usually recovered from the serial data stream to enable correct sampling of the bit stream to be performed. Without this it is possible that errors in data detection will be made. A circuit used to recover a clock signal from a received data stream is generally referred to as a clock recovery circuit.

In U.S. Pat. No. 6,002,279 a clock recovery circuit is disclosed. The clock recovery circuit disclosed can be used for recovering a clock signal from a data stream having a high data rate. The clock recovery circuit includes a phase interpolator and a plurality of non-linear digital-to-analogue converters. The phase interpolator is arranged to receive inputs from two or more of the non-linear digital-to-analogue converters and generate a recovered clock signal in dependence on the received signals. A problem with the clock recovery circuit disclosed in U.S. Pat. No. 6,002,279 is that plural non-linear digital-to-analogue converters are required and therefore the component count in the clock recovery circuit is high.

According to a first aspect of the present invention there is provided a clock recovery circuit for generation of a recovered clock signal from a received data stream using a weighted combination of phase component signals, the clock recovery circuit comprising: a detector to detect the phase of a received data stream; a selector comprising a differential generator arranged to generate at least two related signals in dependence on the detected phase; and a phase generator to receive the at least two related signals and select related proportions of two or more of a plurality of phase component signals for combination, thereby to generate a recovered clock signal.

The clock recovery circuit may comprise: a generator for generating a plurality of phase component signals; a selector to select weighted portions of two or more of the phase component signals to enable generation of a recovered clock signal; the selector comprising a differential generator arranged on receipt of only one signal to generate at least two complementary signals to select complementary proportions of two or more of the plurality of phase component signals.

The invention provides a clock recovery circuit that is able to dispense with the plural digital-to-analogue converters conventionally required, thereby reducing the component count and cost and complexity of the clock recovery circuit. The use of a differential generator ensures that whereas conventionally at least two input signals are required (one for each of the non-linear digital-to-analogue converters), in the present invention the use of a differential generator enables the generation of a desired clock signal in response to only a single input.

According to a second aspect of the present invention, there is provided a method of generating a recovered clock signal, the method comprising: detecting the phase of a received data stream; in dependence on the detected phase, determining a required phase of a sampling clock signal; providing an input signal to a differential generator in dependence on the determined required phase; and at the differential generator, generating at least two complementary signals to select complementary proportions of two or more of a plurality of phase component signals thereby to generate a recovered clock signal at the required phase.

In an embodiment, the method comprises: at a clock recovery circuit, determining the phase of a received signal; in dependence on the determined phase, determining an adjustment required in the phase of a sampling clock signal; providing an input signal to a differential generator in dependence on the determined adjustment to adjust the phase of recovered clock signal the sampling clock signal thereby to generate the recovered clock signal.

According to a third aspect of the present invention there is provided a clock recovery circuit for generation of a recovered clock signal from a received data stream, the clock recovery circuit comprising: a detector to detect the phase of a received data stream; and a selector comprising a differential generator arranged to generate at least two complementary signals in dependence on the detected phase to select complementary proportions of two or more of a plurality of phase component signals thereby to generate a recovered clock signal.

Examples of the present invention will now be described in detail with reference to the accompanying drawings, in which:

FIG. 5 is a table showing an example of digital inputs to a differential digital-to-analogue converter.

Figure 1:
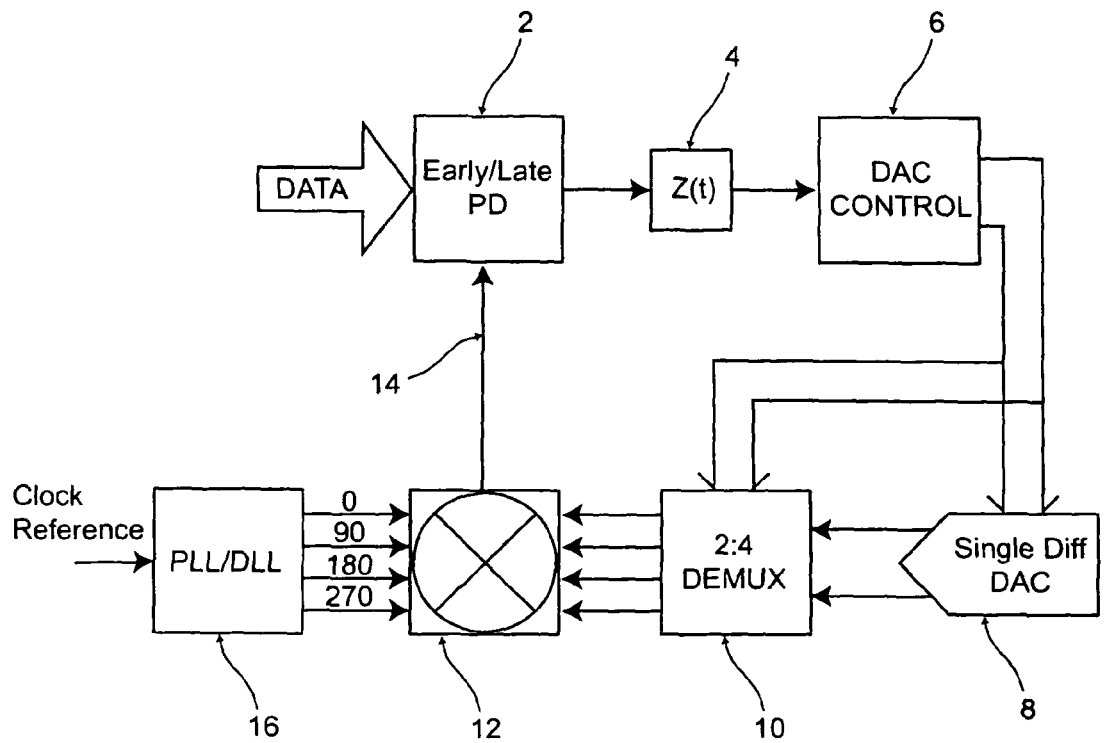
FIG. 1 shows a schematic block diagram of an example of a clock recovery system according to an embodiment of the present invention.

FIG. 1 shows a schematic block diagram of an example of a clock recovery circuit according to an embodiment of the present invention. The circuit includes a digital phase detector 2 arranged to receive a serial data stream from a source (not shown) such as a network link and detect the phase thereof. The phase detector 2 is connected to a low pass filter 4 for filtering received data and passing the received data to a digital-to-analogue converter (DAC) control unit 6. A differential digital-to-analogue converter 8 is arranged to receive a signal from the DAC control unit 6 and provide inputs to a demultiplexer 10, which is also arranged to receive inputs directly from the DAC control unit 6.

A phase interpolator 12 is arranged to receive four clock signals having different phases e.g. each separated from at least one other by a phase difference of 90°. The phase interpolator 12 is also arranged to receive signals from the demultiplexer 10. The phase interpolator functions to generate a recovered clock signal 14 having a desired phase. The recovered clock signal is used to determine the time at which received data is sampled so as to minimise bit error rate. The phase interpolator 12 receives the four clock signals from a clock reference circuit such as a phase locked loop or a delay locked loop 16. Any suitable unit may be used to generate the four clock phases, and typically a circuit such as a voltage controlled oscillator is used.

In use, the DAC control unit 6 may be arranged to determine a code depending on the phase of the received data. The code is coupled to the single differential DAC 8 which uses the code to generate a pair of weighted currents. The weighted currents are passed through selected branches within the demultiplexer 10 to the phase interpolator 12 which uses them to generate a clock signal having a desired phase.

In the example shown, a four-phase phase interpolator 12 is provided. It will be appreciated that any number of phases can be mixed with the circuit shown and also that the phase interpolator may be arranged to receive any desired number of component signals, i.e. not only 4 as in the example described herein.

Importantly, in the system of FIG. 1, a single differential DAC is used. Accordingly, upon receipt of a single input signal from the DAC control unit 6, the single differential digital-to-analogue converter 8 is able to provide two weighted currents (or voltages) to the demultiplexer 10 such that weighted values of two of the four clock signals received by the phase interpolator 12 from the PLL or DLL 16 can be selected.

In the example shown in FIG. 1, a single differential digital-to-analogue converter is used. The differential digital-to-analogue converter is an example of a differential generator that is capable on receipt of one signal to generate at least two related or complementary signals to select related proportions of two or more clock signals of different phases. Whereas conventionally multiple digital-to-analogue converters have been used to provide corresponding inputs to a phase interpolator, in an example of the present invention a single component such as a differential DAC is used. This reduces the overall area of the layout of the clock recovery circuit and in addition reduces the amount of components required to produce the clock recovery circuit.

In another example, instead of using a differential digital-to-analogue converter, a digital-to-analogue converter is used having an output arranged to provide a signal to a differential amplifier. Such an arrangement again enables a single input (to the digital-to-analogue converter) to generate two outputs that are able to select complementary proportions of two or more of a plurality of clock signals having different phases to generate a recovered clock signal.

Figure 2:
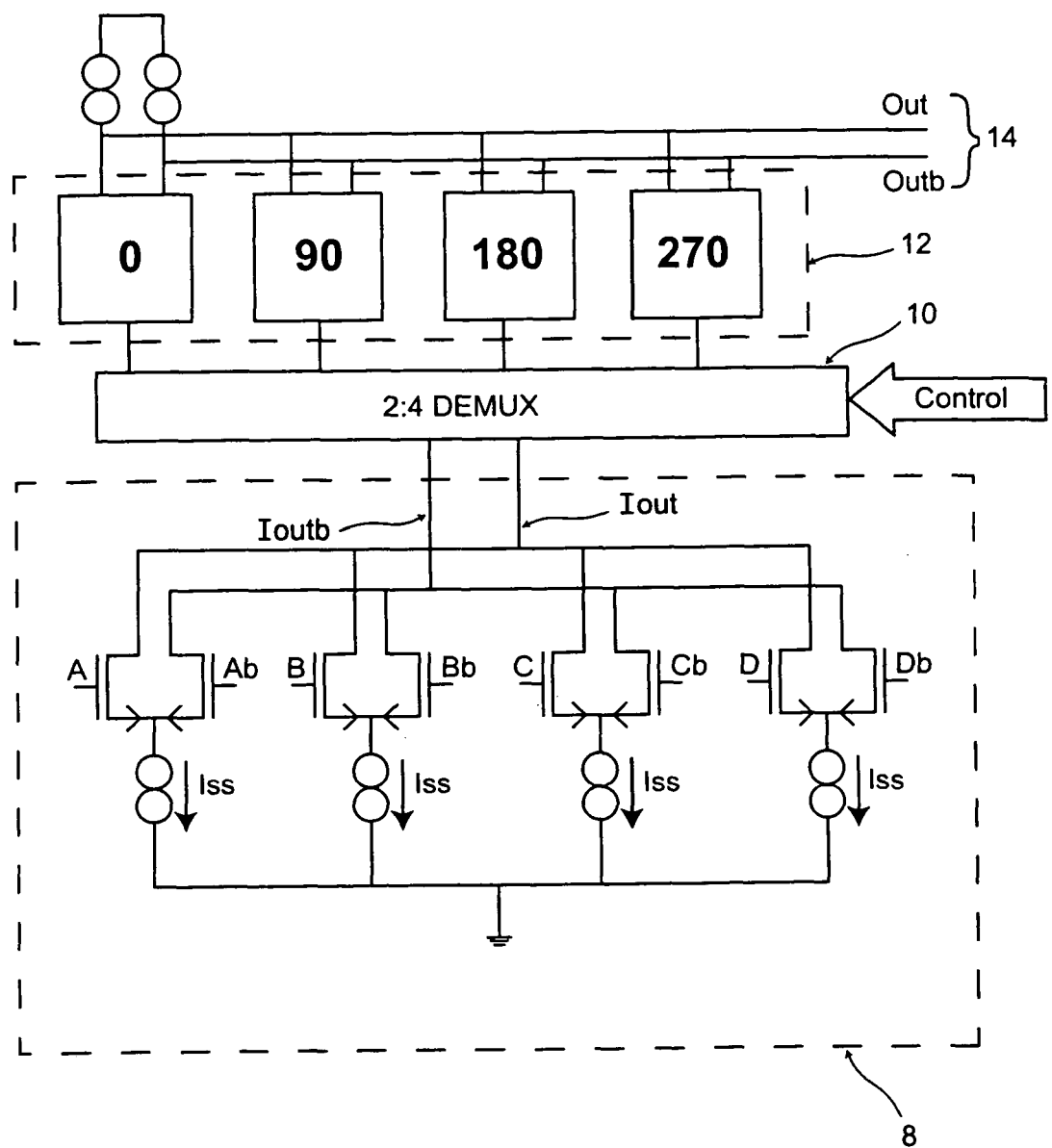
FIG. 2 shows a schematic diagram of a phase selector.

FIG. 2 shows an expanded schematic block diagram of A part of the clock recovery circuit of FIG. 1 having a differential digital-to-analogue converter 8 and a demultiplexer 10. Components in FIG. 2 are numbered in the same way as corresponding components in the circuit of FIG. 1. The demultiplexer 10 is arranged to drive a phase interpolator 12 which in turn provides outputs 14 to sample an incoming serial digital data stream.

The phase interpolator 12 is shown schematically in FIG. 2 as including four phase signals, one at each of 0°, 90°, 180° and 270° relative phase. These signals are received from a source (not shown) such as a voltage-controlled oscillator in a phase locked loop as explained above.

In the example shown a four-phase differential interpolator is provided. This can be expanded to any number of phases if so required.

The phase interpolator 12 comprises a number of tails of transistor pairings (not shown) each connected to an output of the demultiplexer 10. The outputs of the differential DAC 8 are connected to the inputs of the demultiplexer 10. A, B, C, D are digital inputs to the differential DAC provided by the DAC control unit 6 in dependence on a detected phase of the received data stream. Ab, Bb, Cb, Db are the digital inverses of A, B, C and D, respectively and are created by the differential DAC from these inputs. In one possible example, the inputs to the differential DAC 8 may comprise thermometer coded signals, although this type of code is not necessary. In fact, the control codes used will depend on the type of differential DAC used and could just as easily be plain binary code or use any other coding strategy. A thermometer code is preferable for this application through as only a single control bit changes at any one is time hence ensuring that when a phase change occurs the recovered clock always moves in the right direction, i.e. ensures monotonacity. The differential DAC 8 generates analogue currents as outputs that are used to drive the demultiplexer and the phase interpolator 12.

Referring to FIG. 2, if IA, IB, IC, ID, IAb, IBb, ICb and IDb are switched currents from the differential DAC, i.e. the currents flowing through the correspondingly labelled transistors shown in FIG. 2, then currents Iout and Ioutb may be defined as follows:

$I_{out}=IA+IB+IC+ID$ and $I_{outb}=IAb+IBb+ICb+IDb$

The total current flowing from the differential DAC to the demultiplexer is therefor equal to $I_{out}+I_{outb}$. In other words, this is a true differential DAC, in that $I_{outb}=4I_{ss}-I_{out}$ where $4I_{ss}$ is the reference current of the differential DAC. The currents $I_{out}$ and $I_{outb}$ are coupled to the demultiplexer. That in turn is arranged to drive the phase interpolator 12 to provide an output clock signal of a desired phase. The differential DAC therefore provides the functionality previously only achievable with the use of multiple digital-to-analogue converters that have been used in systems to date.

Figure 3:
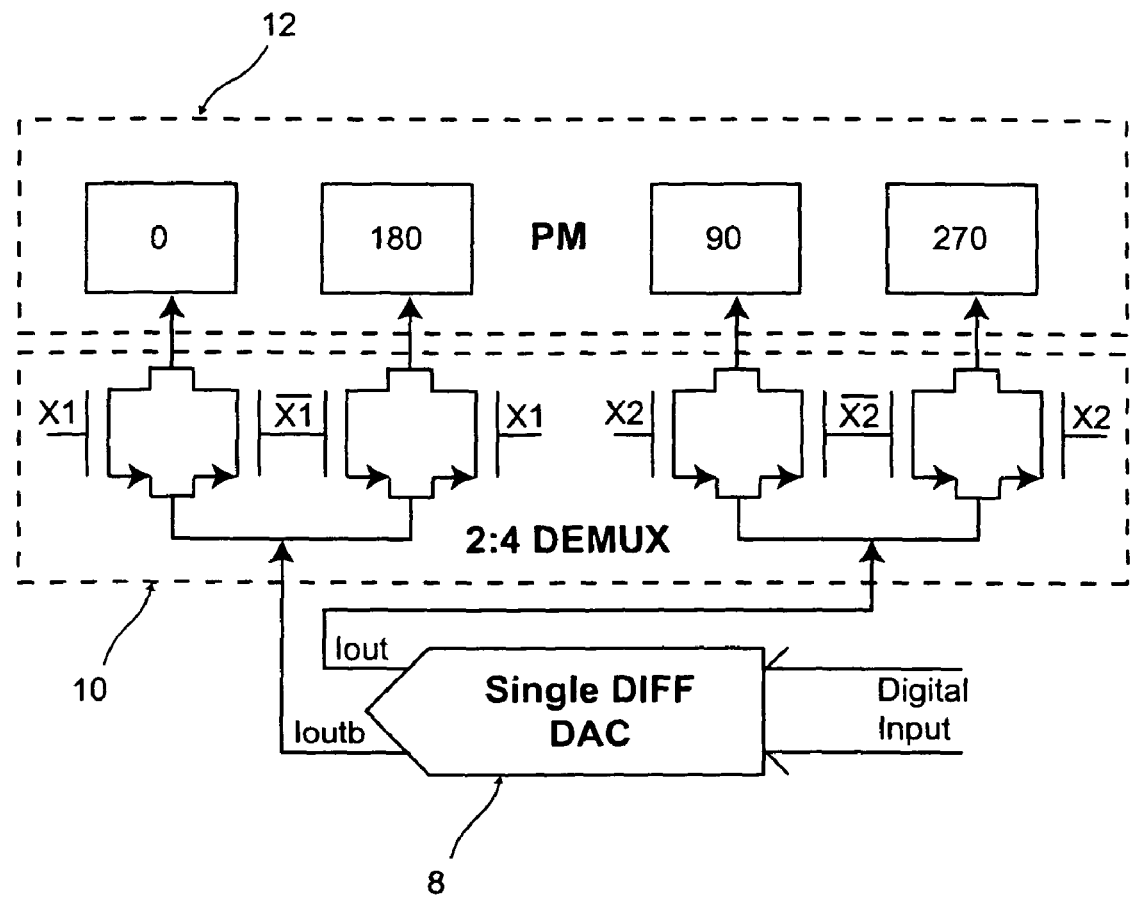
FIG. 3 shows a schematic representation of a selector.

FIG. 3 shows a schematic block diagram of part of the clock recovery circuit of FIG. 1 showing in particular one possible arrangement for a demultiplexer. In this example, components are numbered in the same way as they have been in FIGS. 1 and 2. The demultiplexer 10 is designed to switch the currents $I_{out}$ and $I_{outb}$ received from the differential DAC 8 to any two of the four active parts of the phase interpolator 12, i.e. 0° and 90°, 90° and 180°, 180° and 270°, or 270° and 0°. In this way, the phase of the recovered clock signal derived from the phase interpolator 12 may be controlled to be at one of a number of possible locations between any of the individual phases 0°, 90°, 180° and 270°.

In the example shown, the demultiplexer comprises an arrangement of four pairs of transistors, two pairs arranged to switch the current Iout and two pairs arranged to switch the current $I_{outb}$. Signals X1, $\overline{X1}$, X2 and $\overline{X2}$ are control inputs to the pairs of transistors within the demultiplexer, preferably received from the DAC control unit 6. In an alternative, the DAC control unit 6 may generate the signals X1 and X2 whereas the inverses $\overline{X1}$ and $\overline{X2}$ could be generated internally within the demultiplexer. The signals X1, $\overline{X1}$, X2 and $\overline{X2}$ serve selectively to switch the output currents from the differential DAC 8 so that the recovered clock signal is made up of a weighted combination of a desired pair of the reference signals provided by the Phase Locked Loop or the Delay Locked Loop 16. The weighting of components within the weighted combination are determined by the currents $I_{out}$ and $I_{outb}$. For example, if $I_{out}$ is at a maximum and $I_{outb}$ is equal to zero, the weighting given to the component receiving $I_{out}$ will be 1 and that given to the component receiving $I_{outb}$ will be zero. All possible combinations of weightings may be used.

In some cases, if voltage overhead is a problem, tails (not shown) of the phase interpolator 12 are controlled by voltages and not by current steering. In other words, $I_{out}$ and $I_{outb}$ are replaced with corresponding voltages Vp and Vn.

Figure 4:
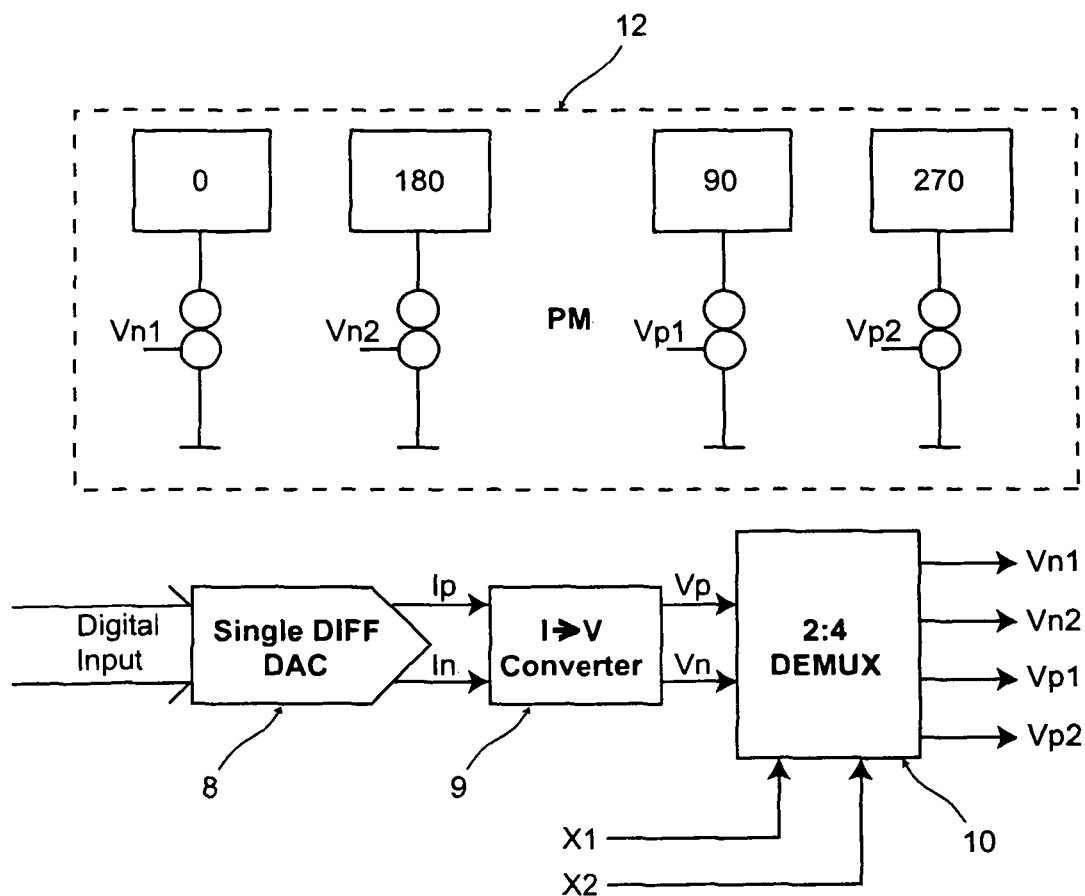
FIG. 4 shows a schematic representation of a phase selector.

FIG. 4 shows an example of an arrangement suitable for providing this functionality. In addition to the components shown in FIG. 3, a current-to-voltage converter 9 is provided between the differential DAC 8 and the demultiplexer 10. This ensures that there are fewer layers in a voltage stack between the differential DAC 8 and the phase interpolator 12 such that overall, a lower supply voltage is required to achieve the necessary functionality.

FIG. 5 is a table showing an example of digital inputs to a differential digital-to-analogue converter, as generated by the DAC control unit 6. In the example shown it can be seen that for each pair of the clock reference signals, there are five possible combinations and accordingly five possible relative phases between each pair of the clock reference signals may be achieved. It will be appreciated that in practice only desired number of phase steps may be provided. Typically, clock recovery phase interpolators usually have at least 64 phase steps, i.e. 16 within each quadrant. Of course, a coding system used to select a weighted combination of the phase signals is required that is capable of selecting/generating recovered clock signal at a desired one of the phase steps.

Referring to the 0° to 90° phase region of FIG. 5, if it is desired that the phase of the output signal 14 from the phase interpolator 12 has a phase of 0°, then the input to the differential DAC 8 will be 1111. This value will be used to generate a first current for provision to the demultiplexer. The differential DAC will determine that the corresponding digital value for generating the second complementary current will be 0000, i.e. the difference between a reference value (1111) and the received input.

Simultaneously, the signals X1, $\overline{X1}$, X2 and $\overline{X2}$ sent to the demultiplexer from the DAC control 6 are controlled so as to divert the currents that will be generated by the differential DAC 8 to the 0° and 90° phase components within the phase interpolator 12. The input that will be received by the tail of the 0° phase component within the phase interpolator may be the maximum possible, i.e. $4I_{SS}$, and the corresponding input that will be received by the tail of the 90° phase component within the phase interpolator 12 will be the minimum possible, e.g. 0 Amps.

If however it is desired that the phase of the recovered clock signal is 90°, the input to the 0° component will be 0 Amps and the input to the 90° component will be $4I_{ss}$. The table in FIG. 5 shows the complete list of possible inputs to the differential DAC 8. It will be appreciated that although two components are provided to the phase interpolator to enable a weighted sum of two phases to be produced, each pair is generated from a single input provided to the differential DAC 8. Accordingly, only a single differential DAC is required. This contrasts with conventional systems in which digital-to-analogue converters are used and two or more are required to achieve the same functionality as that achieved by examples of clock recovery circuits described herein.

Embodiments of the present invention have been described with particular reference to the examples illustrated. However, it will be appreciated that variations and modifications may be made to the examples described within the scope of the present invention.

The invention claimed is:

1. A clock recovery circuit for generation of a recovered clock signal from a received data stream using a weighted combination of phase component signals, the clock recovery circuit comprising:

a detector to detect the phase of a received data stream;
a selector comprising a differential generator arranged to generate at least two related signals in dependence on the detected phase;
a clock signal generator to receive the at least two related signals and select related proportions of two or more of a plurality of phase component signals for combination, thereby to generate a recovered clock signal, in which the selector comprises a demultiplexer to receive an input from the differential generator and switch an output to corresponding parts of a phase interpolator, and
a current-to-voltage converter arranged to receive current outputs from the differential generator and generate corresponding voltage signals for use in selecting the desired proportions of the phase component signals.

2. A method of generating a recovered clock signal, the method comprising:

detecting the phase of a received data stream;
in dependence on the detected phase, determining the required phase of a sampling clock signal;
providing an input signal to a differential generator in dependence on the determined required phase; and
at the differential generator, generating at least two related signals to select related proportions of two or more of a plurality of phase component signals; and
providing said related signals to a clock signal generator thereby to generate a recovered clock signal at the required phase;
in which upon receipt of the input signal at the differential generator, two signals are generated, a first one of the two signals corresponding to the received input signal, and a second one of the two signals corresponding to the difference between the first one of the two signals and a reference value;
in which the two signals are currents.

3. The method according to claim 2, comprising sending the currents to a phase interpolator, each of the currents being used to select a proportionally weighted component of a phase signal on to generate, in combination, a recovered clock signal.

4. The method according to claim 3, comprising prior to sending the currents to the phase interpolator, converting the currents to voltages.

5. A clock recovery circuit for generation of a recovered clock signal from a received data stream using a weighted combination of phase component signals, the clock recovery circuit comprising:

a detector to detect the phase of a received data stream;
a selector comprising a differential generator arranged to generate at least two related weighted signals in dependence on the detected phase; and
a clock signal generator to receive the at least two related signals and select related proportions of two or more of a plurality of phase component signals for combination, thereby to generate a recovered clock signal, wherein the differential generator uses current mode circuitry to generate currents proportional to required voltages to select the related proportions of the phase component signals.

* * * * *